US011742702B2

(12) United States Patent
Muratov

(10) Patent No.: US 11,742,702 B2
(45) Date of Patent: Aug. 29, 2023

(54) RAPID VALIDATION OF FOREIGN OBJECT DETECTION IN WIRELESS POWER TRANSMITTERS

(71) Applicant: MEDIATEK Singapore Pte. Ltd., Singapore (SG)

(72) Inventor: Vladimir Alexander Muratov, San Jose, CA (US)

(73) Assignee: MEDIATEK Singapore Pte. Ltd., Singapore (SG)

( * ) Notice: Subject to any disclaimer, the term of this patent is extended or adjusted under 35 U.S.C. 154(b) by 79 days.

(21) Appl. No.: 17/465,521

(22) Filed: Sep. 2, 2021

(65) Prior Publication Data

US 2022/0094208 A1    Mar. 24, 2022

Related U.S. Application Data

(60) Provisional application No. 63/081,947, filed on Sep. 23, 2020.

(51) Int. Cl.
*H02J 50/60* (2016.01)
*G01K 7/42* (2006.01)
(Continued)

(52) U.S. Cl.
CPC ............... *H02J 50/60* (2016.02); *G01K 7/42* (2013.01); *G01R 31/40* (2013.01); *H02J 50/12* (2016.02)

(58) Field of Classification Search
CPC ............ G01R 29/0814; G01R 27/2611; G01R 29/0807; G01K 7/22; G01K 1/026; G01K 1/143; G01K 17/00
See application file for complete search history.

(56) References Cited

U.S. PATENT DOCUMENTS

2013/0307348 A1* 11/2013 Oettinger ............... H02J 50/60
307/104
2014/0111154 A1* 4/2014 Roy ........................ H01F 38/14
320/108
(Continued)

FOREIGN PATENT DOCUMENTS

| CN | 110168412 A | 8/2019 |
|---|---|---|
| TW | 201630297 A | 8/2016 |
| TW | 201944698 A | 11/2019 |

*Primary Examiner* — Jermele M Hollington
*Assistant Examiner* — Temilade S Rhodes-Vivour
(74) *Attorney, Agent, or Firm* — Wolf, Greenfield & Sacks, P.C.

(57) ABSTRACT

A test apparatus for testing a foreign object detection (FOD) capability of a wireless power transmitter. The test apparatus includes a wireless power test receiver and at least one temperature sensor configured to sense a temperature of a foreign object between the wireless power test receiver and the wireless power transmitter during wireless power transfer between the wireless power transmitter and the wireless power test receiver. The test apparatus also includes a memory configured to store temperatures sensed by the at least one temperature sensor over a test period in which the wireless power transfer occurs and temporal information regarding times the temperatures are sensed, and a processor configured to calculate, based on the temperatures and the temporal information, a predicted temperature of the foreign object at a future point in time after the test period, and to determine a test result based on the predicted temperature.

24 Claims, 7 Drawing Sheets

(51) Int. Cl.
 *G01R 31/40* (2020.01)
 *H02J 50/12* (2016.01)

(56) References Cited

U.S. PATENT DOCUMENTS

| | | | |
|---|---|---|---|
| 2015/0109000 A1* | 4/2015 | Sieber | B60L 53/124 |
| | | | 324/655 |
| 2020/0076244 A1* | 3/2020 | Smith | H01F 27/402 |
| 2020/0227935 A1 | 7/2020 | Mehta et al. | |

* cited by examiner

RAPID VALIDATION OF FOREIGN OBJECT DETECTION IN WIRELESS POWER TRANSMITTERS

CROSS-REFERENCE TO RELATED APPLICATIONS

This application claims priority to U.S. Provisional Patent Application 63/081,947, filed Sep. 23, 2020, entitled "QUICK TEST TO VALIDATE FOREIGN OBJECT DETECTION IN WIRELESS POWER TRANSMITTERS," which is hereby incorporated by reference in its entirety.

BACKGROUND

1. Technical Field

The techniques described herein relate generally to wireless power delivery, and particularly to testing the ability of a wireless power transmitter to detect foreign objects in the field produced by a wireless power transmitter, termed foreign object detection (FOD).

2. Discussion of the Related Art

Wireless Power Transfer Systems (WPTS) are gaining increasing popularity as convenient way to deliver power without wires or connectors. WPTS currently under development in the industry can be separated in two major classes: magnetic induction (MI) systems and magnetic resonance (MR) systems. Both types of systems include a wireless power transmitter and a wireless power receiver. Such systems can be used to power or charge mobile devices such as smartphones or tablet computers, among other applications. Such a mobile device includes a wireless power receiver that can have power transferred thereto wirelessly by a wireless power transmitter. A wireless power transmitter may be within a pad or stand on which the mobile device can be placed, for example, during wireless charging.

Inductive WPTS typically operate in an allocated frequency range of several hundred kilohertz using frequency variation as a power flow control mechanism.

MR WPTS typically operate on a single resonant frequency using input voltage regulation to regulate output power. In typical applications, MR WPTS operate at a frequency of 6.78 MHz.

Several industry committees have been working on developing international standards for consumer products based on wireless power transfer.

SUMMARY

Some embodiments relate to a test apparatus for testing a foreign object detection (FOD) capability of a wireless power transmitter, the test apparatus comprising: a wireless power test receiver; at least one temperature sensor configured to sense a temperature of a foreign object between the wireless power test receiver and the wireless power transmitter during wireless power transfer between the wireless power transmitter and the wireless power test receiver; a memory configured to store temperatures sensed by the at least one temperature sensor over a test period in which the wireless power transfer occurs, and temporal information regarding times the temperatures are sensed; and a processor configured to calculate, based on the temperatures and the temporal information, a predicted temperature of the foreign object at a future point in time after the test period, and to determine a test result based on the predicted temperature.

Some embodiments relate to a method of testing a foreign object detection (FOD) capability of a wireless power transmitter, the method comprising: sensing, by at least one temperature sensor, a temperature of a foreign object between a wireless power test receiver and the wireless power transmitter during wireless power transfer between the wireless power transmitter and the wireless power test receiver; storing, by a memory, temperatures sensed by the at least one temperature sensor over a test period in which the wireless power transfer occurs, and temporal information regarding times the temperatures are sensed; and calculating, by a processor, based on the temperatures and temporal information, a predicted temperature of the foreign object at a future point in time after the test period, such that a test result is determined based on the predicted temperature.

Some embodiments relate to a non-transitory computer readable storage medium having stored thereon instructions, which, when executed by a processor, perform a method of testing a foreign object detection (FOD) capability of a wireless power transmitter, the method comprising: obtaining, from a memory, temperatures of a foreign object sensed by at least one temperature sensor over a test period during which the foreign object is between a wireless power test receiver and the wireless power transmitter, and temporal information regarding times the temperatures are sensed; and obtaining, by a processor, from the temperatures and temporal information, a predicted temperature of the foreign object at a future point in time after the test period.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

Figure 1:
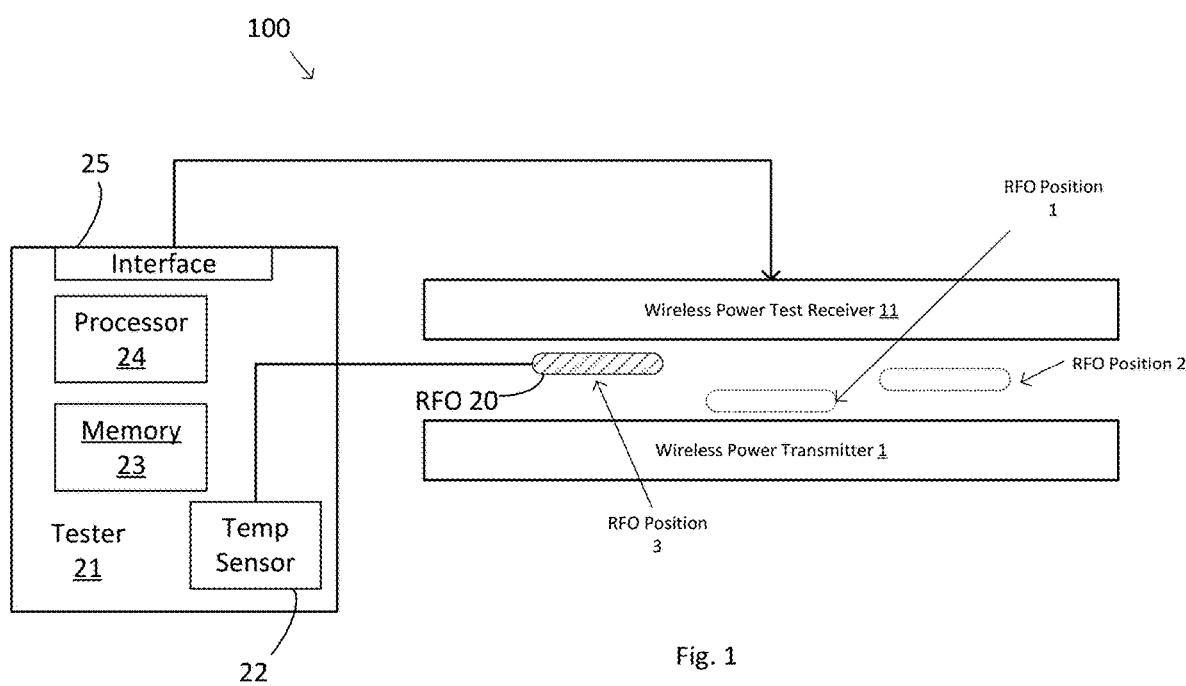
FIG. 1 shows an example of a test apparatus for testing the FOD capabilities of a wireless power transmitter, according to some embodiments.

Wireless power transfer can be degraded due to the presence of a foreign object in the field produced by the wireless power transmitter. Conductive objects such as metallic objects may absorb power due to the inducement of eddy currents in the conductive object. The presence of such an object can significantly degrade the efficiency of wireless power transmission. If a metal object is present, efficiency may be reduced substantially (e.g., from 90% to 40%). Further, due to the power absorbed, the temperature of the object may increase significantly. Techniques have been developed for sensing the presence of a foreign object by measuring the power loss or by measuring the quality factor (Q-factor). According to such techniques, measuring the Q-factor can be used to determine if a foreign object is present, as the presence of a foreign object reduces the Q-factor of the system, and the presence of high power loss indicates the presence of a foreign object absorbing the power. In the power loss technique, the power transmitted by the wireless power transmitter and received by the wireless power receiver may be measured. The power loss is the difference between the two measurements. If the power loss is outside an acceptable range (above a threshold), a foreign object may be determined to be present, and a foreign object is determined to be absent when the power loss is within an acceptable range. For the Q-factor measurement technique, if the Q-factor is outside of an acceptable range, it may be determined that a foreign object is present, and wireless power transmission may be disabled. On the other hand, if the Q-factor within an acceptable range, it may be determined that no foreign object is present, and wireless power transmission may be allowed. When a foreign object is detected, the wireless power transmitter may terminate wireless power transfer or reduce the power level.

A wireless power transmitter may undergo tests to validate its ability to detect a foreign object. Such a test may include initiating wireless power transfer between a wireless power transmitter and a wireless power receiver when a reference foreign object (RFO) is between the wireless power transmitter and the wireless power receiver. The temperature of the RFO is measured, and if the temperature of the RFO exceeds a maximum temperature threshold within a predetermined test period, the wireless power transmitter has failed the test. If the temperature of the foreign object does not exceed the allowed value within the predetermined test period, the wireless power transmitter has passed the test. However, the inventor has recognized and appreciated that such a test may take a significant amount of time, from several tens of minutes to an hour for each test. Further, the test may need to be repeated with the RFO in different positions. A lengthy test period may tie up test resources and/or lead to high testing costs.

In some embodiments, the amount of time needed to test a wireless power transmitter may be reduced by measuring the temperature of the foreign object at one or more points in time during wireless power transfer, and using the measured temperatures and measurement times to predict the temperature of the foreign object at a later point in time. Any suitable type of prediction may be performed, such as linear prediction or logarithmic prediction (e.g., using a linear or logarithmic regression), for example. If the predicted temperature at a future point in time is below the threshold, the wireless power transmitter passes the test. If the predicted temperature is above the threshold, the wireless power transmitter fails the test.

FIG. 1 shows an example of a test apparatus 100 for testing the FOD capabilities of a wireless power transmitter 1, according to some embodiments. The test apparatus 100 includes a tester 21, a wireless power test receiver 11 separated from the wireless power transmitter 1 by a gap, and a reference foreign object ("RFO," also "FO" or "foreign object") 20 that may be placed at various test positions between the wireless power transmitter 1 and the wireless power test receiver 11. In the example of FIG. 1, the RFO 20 is placed at RFO Position 3. However, the RFO 20 may be placed at any suitable position, such as RFO position 1 or RFO position 2, for example. The tester 21 includes a temperature sensor 22 for sensing the temperature of RFO 20, a memory 23, a processor 24 and an interface 25 for communicating with the wireless power test receiver 11.

The test apparatus 100 may operate as follows. The RFO 20 may be placed in the desired position, and the processor 24 of the tester 21 may initiate a test program stored in the memory 23. The test program may cause the tester 21 to control the wireless power test receiver 11 to have suitable characteristics (e.g., power loading) and/or communicate with the wireless power transmitter to bring the wireless power transmitter 1 to a desired power level of wireless power transmission. To do so, the wireless power test receiver 11 may communicate with the wireless power transmitter 1 in accordance with a communication protocol supported by the wireless power transmitter 1. The temperature sensor 22 measures the temperature of the RFO 20 at various times over a test period, and may store the measured temperature values and their measurement times in the memory 23. At a suitable time, the processor 24 may use the measured temperature values and their measurement times to predict the temperature of the RFO 20 at a future time after the end of the test period (in which wireless power transfer occurs). The test may then pass or fail based on whether the predicted future temperature exceeds a threshold. In other embodiments, the tester 21 may send the temperature measurements to another computing device (e.g., a server) to perform the prediction, and the result of the prediction (e.g., predicted temperature value, pass/fail) may be sent back to the tester 21, as the techniques described herein are not limited to the tester 21 performing the prediction.

Figure 2A:
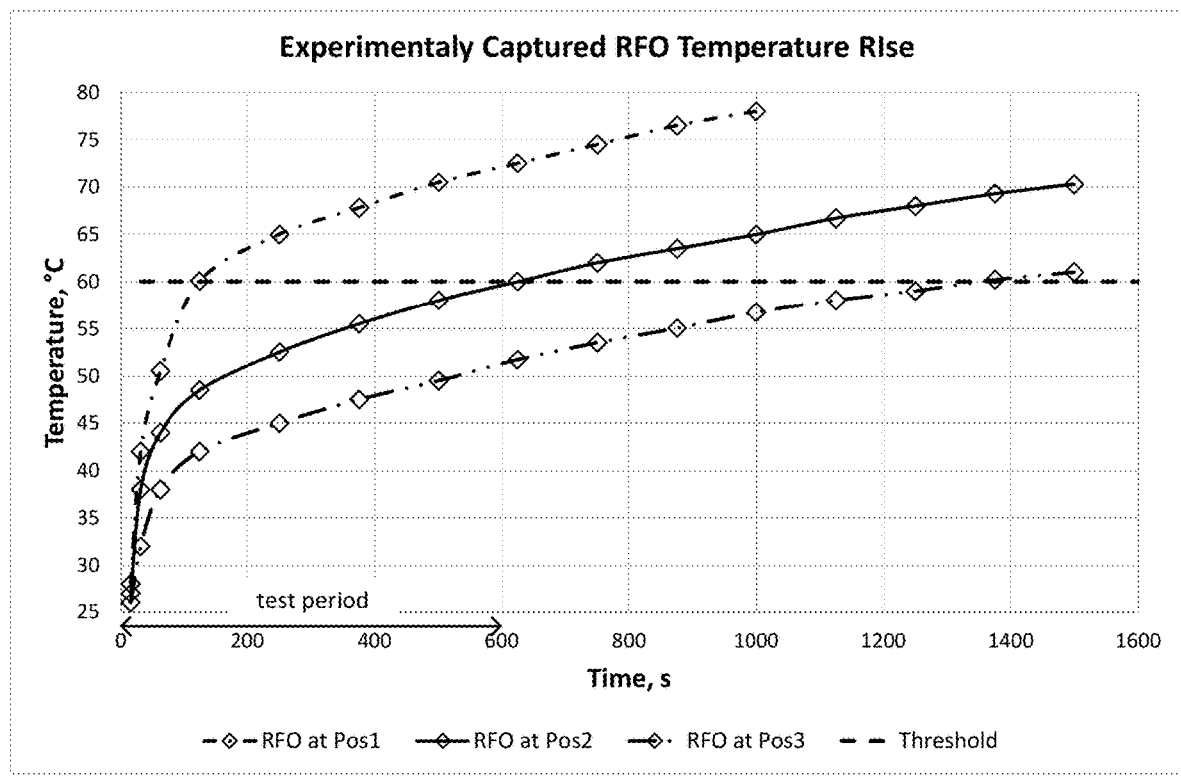
FIG. 2a shows plots of reference foreign object (RFO) temperature rise over time during FOD testing, with the RFO at different positions.

Due to magnetic field spatial variations, the temperature rise in the RFO 20 can vary significantly when the RFO 20 is placed at different positions. Therefore, in some embodiments, the test may be performed a plurality of times with the RFO 20 being placed in different positions. FIG. 2a shows temperature rise curves captured over time with the RFO 20 placed in three exemplary positions. Correspondence between RFO 20 spatial position and slew rate of the temperature rise curve may not be exact and is given here as an example of the variety of possible scenarios.

FIG. 2a shows the RFO 20 temperature rises most quickly in Position 1 and reaches the exemplary threshold of 60° C. before the exemplary test period of 600 s (10 min) expires. This is an example of wireless power transmitter 1 failing the test, as the RFO 20 temperature exceeds the threshold within the established test period.

Figure 2B:
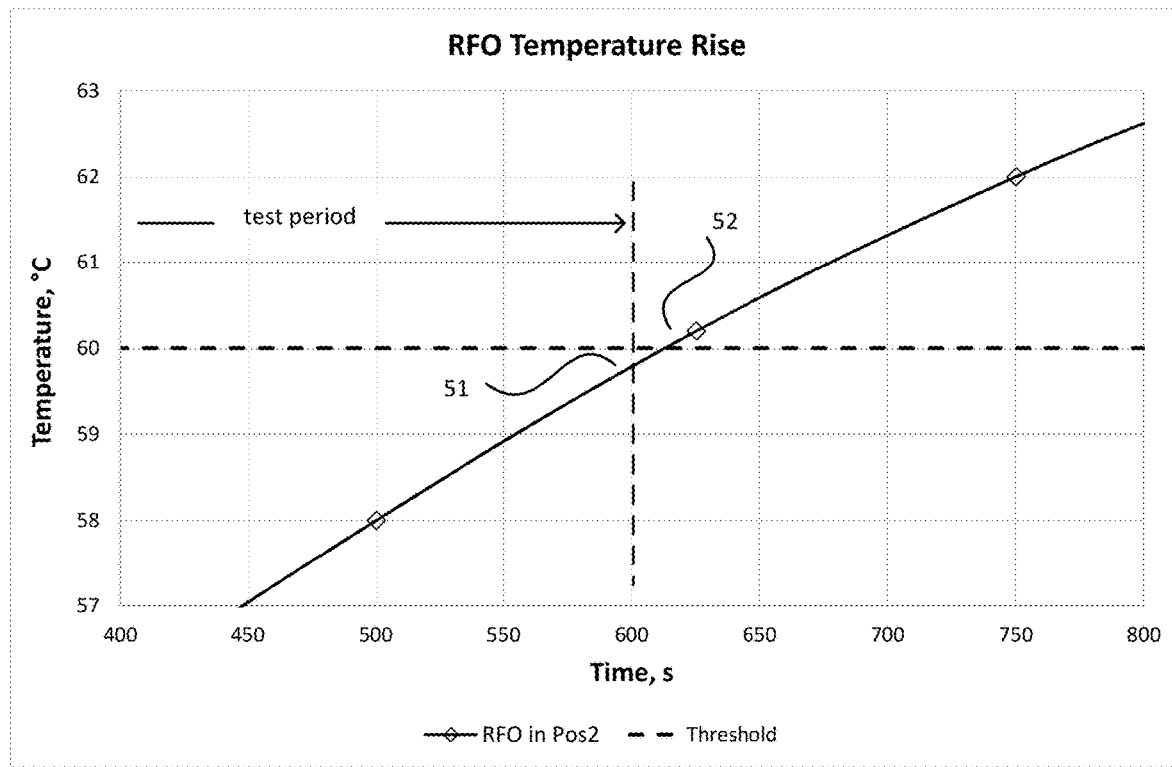
FIG. 2b shows a zoomed in portion of FIG. 2a where a RFO at Position 2 crosses the threshold.

FIG. 2a shows the RFO 20 temperature rises more slowly in Position 2, and does not reach the threshold within the test period, but exceeds the threshold soon after the test period expires. FIG. 2b shows the zoomed in RFO temperature rise curve of FIG. 2a for Position 2, where it crosses the threshold of 60° C. At the end of the test period (600 s in this example), the RFO 20 temperature is slightly under the threshold, point 51, but exceeds the threshold soon after the test stop-time, point 52. Formally, this constitutes "passing" the test, though it is a marginal case that may not be acceptable.

FIG. 2a shows in Position 3 the RFO temperature remains substantially lower than the threshold during the test period but eventually exceeds it significantly later. The outcome of this test may be considered satisfactory. Formally, per currently established rules under Qi and IEC standards, this is a "passing" result, though a cautious product manufacturer may consider this test result to be unsatisfactory.

The scenarios associated with Position 2 and Position 3 can be observed by testing for a sufficiently long test period. However, as mentioned above, it would be desirable to keep the test period as short as possible. Accordingly, in some embodiments, predicting future temperature values of the RFO may allow for keeping the test period short, while providing a level of confidence that the temperature of the foreign object will not exceed the threshold during a finite, extended time interval.

Figure 2C:
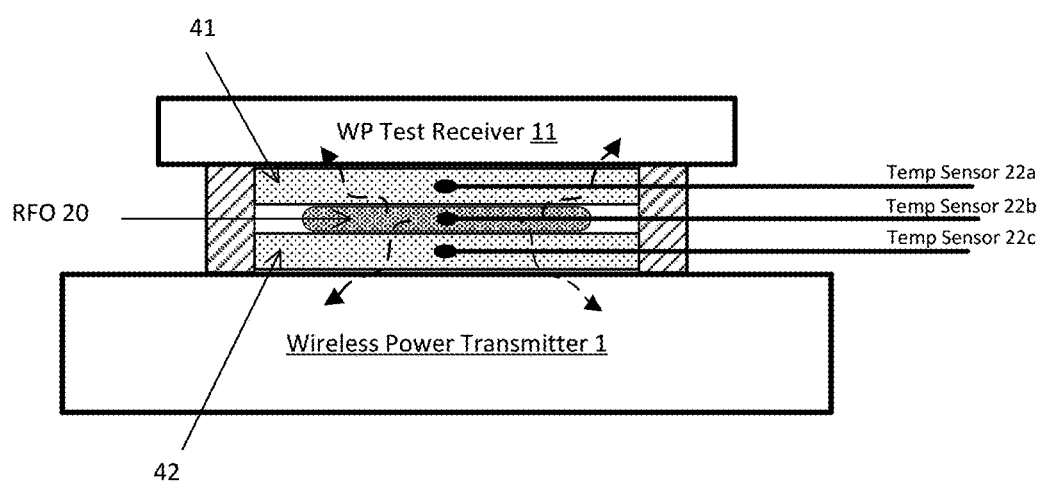
FIG. 2c shows an example of a test setup with thermally conductive material and a plurality of temperature sensors to perform a differential temperature measurement.

The RFO 20 can be made of various materials and may have various shapes to simulate various practical cases. Also, the RFO 20 can be constructed in a way that mitigates thermal effects on it from the wireless power test receiver 11 and the wireless power transmitter 1. For example, such an RFO 20 can be layered between, or embedded within materials with predefined thermal conductivity, that provide repeatable RFO temperature readouts due to power dissipated as a result of the RFO's interaction with magnetic field generated by the wireless power transmitter 1 rather than the heat from the wireless power transmitter 1 or the wireless power test receiver 11. FIG. 2c shows a diagram of a test setup in which the RFO 20 is layered between a top thermally conductive layer 41 and a bottom thermally conductive layer 42, which define heat transfer between the RFO 20 to the wireless power test receiver 11 and wireless power transmitter 1, respectively. In some embodiments, thermally conductive materials 41 and 42 may have a thermal insulation value of 5<Rth<150° C./W.

In some embodiments, a differential temperature measurement of the RFO 20 temperature may be performed. For example, in the diagram of FIG. 2c a differential temperature measurement of RFO 20 is performed using three temperature sensors 22a, 22b, and 22c, which measure the temperatures within the thermally conductive layer 41, RFO 20 and thermally conductive layer 42, respectively. The temperature sensor(s) 22 (including 22a, 22b and 22c) may be any suitable type of temperature sensors such as thermocouples, for example.

Figure 3:
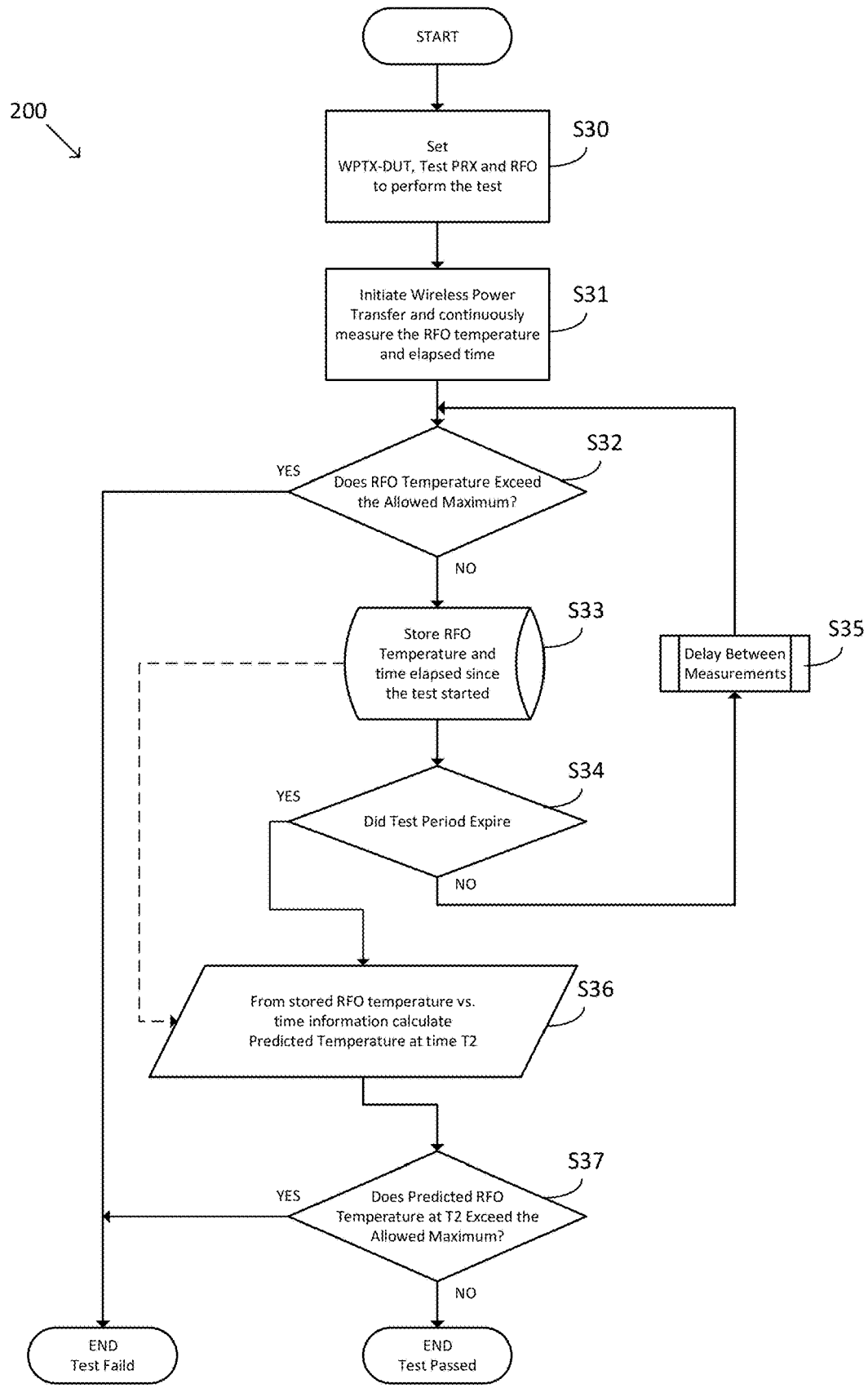
FIG. 3 shows a test method for testing the foreign object detection capabilities of a wireless power transmitter, according to some embodiments.

FIG. 3 shows a test method 200 for testing the foreign object detection capabilities of a wireless power transmitter, according to some embodiments. In step S30, wireless power transmitter 1 (WPTX-DUT), wireless power test receiver 11 (Test PRX) and RFO 20 are positioned and configured for the test. In step S31, wireless power transfer may be initiated between the wireless power transmitter 1 and the wireless power test receiver 11, and the RFO temperature measurements begin. In step S32, it is checked whether the RFO temperature has exceeded the allowed maximum temperature (threshold). If so, the wireless power transmitter 1 has failed the test, and the test ends. If not, the temperature of the RFO as well as the time the measurement was taken is stored in step S33. It is then checked whether the test period has expired in step S34. If not, after a suitable delay between measurements (S35), the method proceeds back to step S32, and measurements may be repeated until either the maximum RFO temperature is exceeded, or the test period expires. When the test period is determined to expire at step S34, a prediction of the future temperature of the RFO at a future time (T2) after the test period is made in step S36. As mentioned above, the prediction may be performed using the temperature measurements and timing information. For example, in some embodiments temperature measurements and their times may be considered as points, and a linear or logarithmic regression may be performed to obtain a line or logarithmic curve that fits the points. The predicted temperature at time T2 may be evaluated in step S37. For example, the line or logarithmic curve may be evaluated for the future time T2. If the predicted temperature for time T2 exceeds the threshold, then the test fails. If not, then the test passes. The result of the test may be communicated to a person in any suitable way, such as by being displayed on a display device that is part of or connected to the tester 21.

Figure 4A:
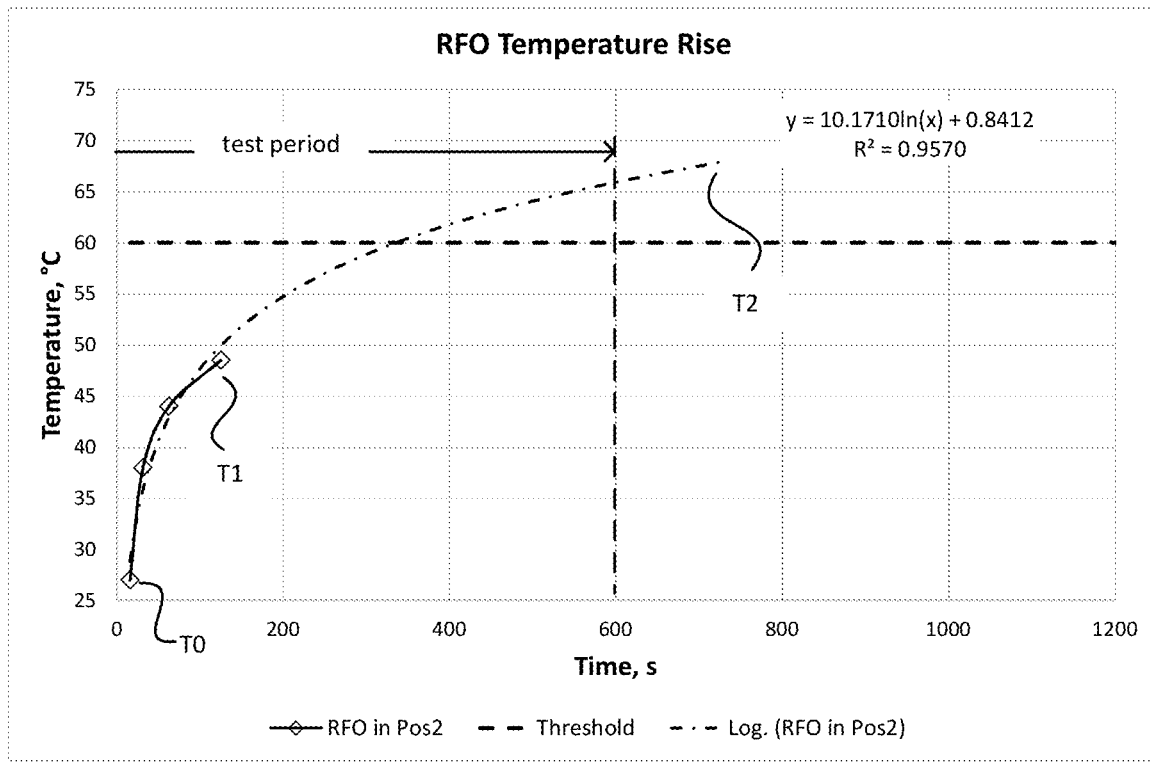
FIG. 4a shows a logarithmic RFO temperature rise prediction based on temperature measurements at the start of a test period.

FIG. 4a depicts a RFO 20 temperature rise prediction using acquired RFO readings at various time intervals within the test period. Time T0 is the beginning and T1 is the end of data acquisition. The test period is the time period for which wireless power transfer occurs for testing purposes. Time T2 is the future time for which temperature prediction is calculated. In this example, prediction is performed by fitting a natural logarithm curve to the data (e.g., using logarithmic regression).

The following relations are true for times T0, T1, T2.
T0≥0—data acquisition for purpose of predicting RFO temperature rise starts at or after the beginning of wireless power transfer.
T0<T1≤test-end time
T2≥test-end time In FIG. 4a, temperature data points are acquired at the very beginning of the test (e.g., T0 is about 20 s). Since the temperature is changing quickly at the beginning of the test, and changes less quickly later in the test, using data from the beginning of the test may lead to less precise prediction compared to using data from later in the test. In particular, using data from early in the test may tend to over-estimate the future temperature of the RFO 20.

Figure 4B:
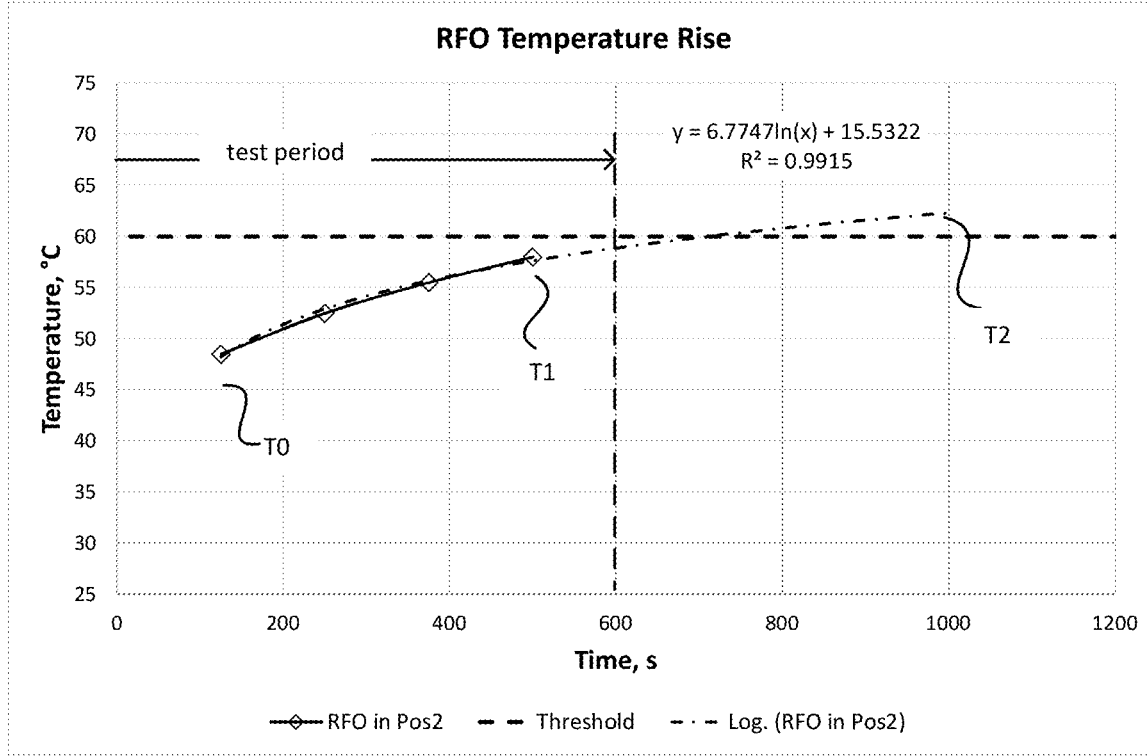
FIG. 4b shows a logarithmic RFO temperature rise prediction based on temperature measurements later in the test period.

FIG. 4b shows an embodiment where the prediction is performed using temperatures measured later in the test period. In this example, T0 and T1 are later in time compared to the embodiment of FIG. 4a. Since the temperature is changing more slowly later in the test, the prediction of the temperature of the RFO 20 can be more accurate. Note the regression coefficient $R^2$ is higher in the case of FIG. 4b compared to the case of FIG. 4a. In some embodiments, the measurements may be postponed by a delay, or measurements may not be postponed, and measurements used for prediction may be those acquired after a suitable delay. In some embodiments, the delay may be at least 30 or 60 seconds, and less than half of the test period. However, this is an example, and any suitable delay may be used.

Figure 5:
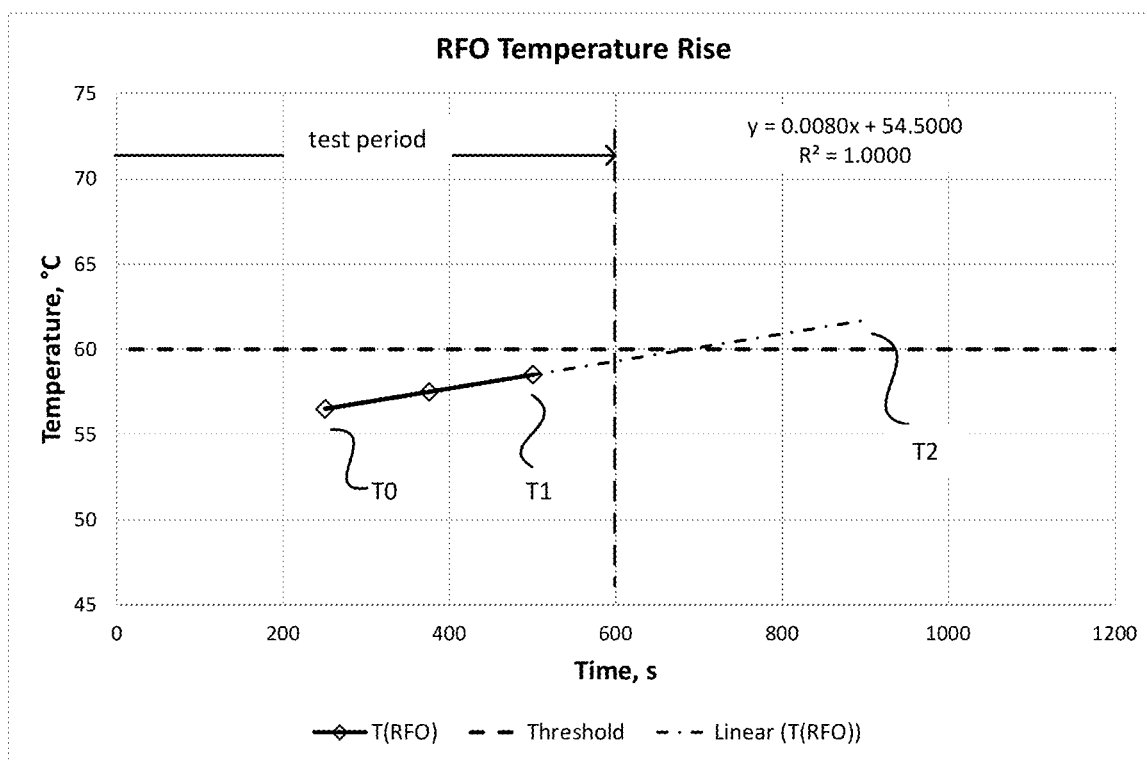
FIG. 5 shows a linear RFO temperature rise prediction.

FIG. 5 shows an embodiment where linear prediction is used. Linear prediction requires fewer computing resources compared to logarithmic prediction. Linear prediction (e.g., regression) is most accurate when the RFO temperature approaches the maximum allowable temperature threshold (Threshold in FIG. 5) and the end of the test period is approaching. For example, linear regression can be used when the RFO temperature is within 10% of the threshold. In such circumstances, the error associated with the prediction can be very small and computational resources can be saved to perform other tasks. Linear regression is one way of performing linear prediction. Other ways of performing a linear prediction may involve using either the slew rate of temperature rise or an angle at which the RFO temperature rises when approaching the threshold, for example. In some embodiments, when the regression has a high degree of linearity (e.g., $R^2>0.9$) and the temperature prediction for T2 exceeds the threshold, it may be determined that the wireless power transmitter has failed the test.

The test tool designer may use different prediction techniques and their numerical expressions optimized for various microprocessor implementations. In some embodiments, a combination of different prediction techniques may be used. For example, a logarithmic prediction may be used when the RFO 20 temperature is well below the threshold, and a linear prediction may be used when the RFO 20 temperature is closer to the threshold. The internal temperature of the wireless power test receiver 11 during the test can also be an influencing factor on use of approximation method per yet another embodiment.

The approximation method and mathematical expression can also be chosen based on RFO construction. For example, in some embodiments where several thermal sensors (e.g., thermocouples) are used within the RFO 20, calculation of average temperatures between thermocouples, or other mathematical operations can be used to aid in test robustness.

A discussion of wireless power transfer and associated devices follows.

Figure 6:
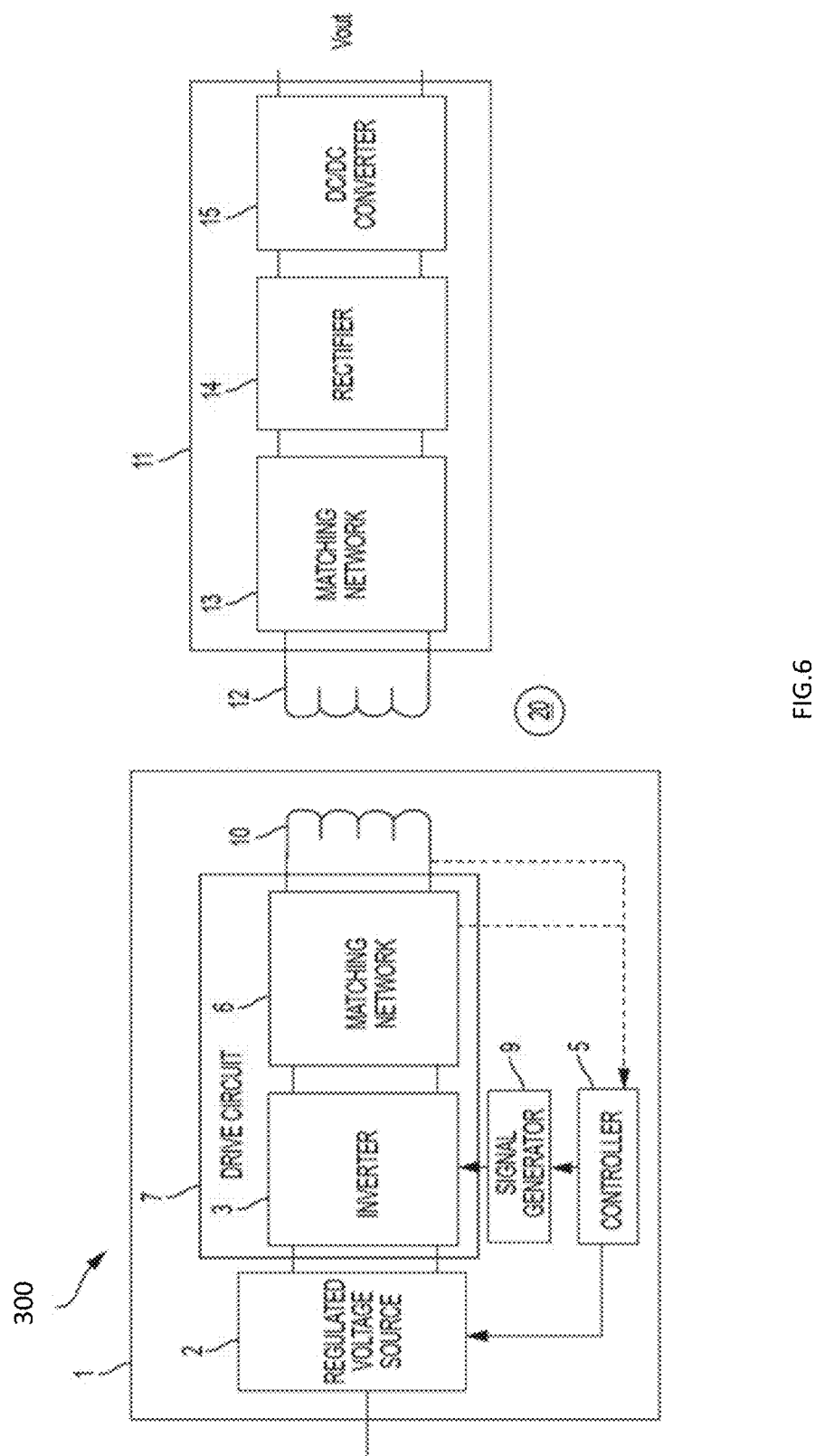
FIG. 6 shows a block diagram of the wireless power system including a wireless power transmitter and a wireless power receiver.

FIG. 6 shows a block diagram of the wireless power system 300 including a wireless power transmitter 1 and a wireless power test receiver 11. The wireless power transmitter 1 has a drive circuit 7 including an inverter 3 that drives a transmit coil 10 through a matching network 6. The wireless power transmitter 1 may include a regulated voltage source 2 (e.g., a voltage regulator) that provides a regulated DC voltage to the inverter 3. The regulated voltage source 2 produces a regulated DC output voltage in response to control stimulus from the controller 5. In some embodiments, the drive circuit 7 may be a class D or E amplifier that converts the DC voltage at the input of inverter 3 into an AC output voltage to drive the transmit coil 10. Producing an AC output voltage enables wireless power transmission through electromagnetic induction. The controller 5 may control a signal generator 9 to drive the inverter 3 with signals of a selected wireless power transmission frequency. As an example, the inverter 3 may be switched at a frequency between 100 and 205 kHz to transmit power to a wireless power receiver designed to receive wireless power according to the Qi specification for low power Qi receivers and 80-300 kHz for medium power Qi receivers. The inverter 3 may be switched at a higher frequency, such as a frequency of greater than 1 MHz, within an ISM band, e.g., 6.765 MHz to 6.795 MHz, to transmit power to a receiver designed to receive wireless power using MR technology. However, these frequencies are described merely by way of example, as wireless power may be transmitted at a variety of suitable frequencies, in accordance with any suitable specification. Controller 5 may be an analog circuit or a digital circuit. Controller 5 may be programmable, and may command signal generator 9 to produce signals at a desired transmission frequency based on stored program instructions, so that inverter 3 switches at the desired transmission frequency. Matching network 6 may facilitate wireless power delivery by presenting a suitable impedance to the inverter 3. The matching network(s) may have one or more capacitive or inductive elements or any suitable combination of capacitive and inductive elements. Since the transmit coil 10 may have an inductive impedance, in some embodiments the matching network 6 may include one or more capacitive elements, which, when combined with the impedance(s) of the transmit coil 10, presents an impedance to the output of inverter 3 suitable for driving the transmit coil 10. In some embodiments, during wireless power transfer the resonant frequency of the matching network 6 may be set equal to or approximately equal to the switching frequency of the inverter 3. The transmit coil 10 may be realized by any suitable type of conductors. The conductors may be wires, including solid wire or Litz wire, or patterned conductors, such as patterned conductors of a PC board or an integrated circuit.

The AC current in the transmit coil 10 generates an oscillating magnetic field in accordance with Ampere's law. The oscillating magnetic field induces an AC voltage into a receiver coil 12 of the wireless power receiver 11 in accordance with Faraday's law. The AC voltage induced in the receiver coil 12 is provided through a matching network 13 to a rectifier 14 that generates an unregulated DC voltage. Rectifier 14 may be a synchronous rectifier or may be implemented using diodes. The unregulated DC voltage is regulated using a DC/DC converter 15, the output of which may be filtered and provided to a load as output voltage Vout. In some alternate embodiments the DC/DC converter 15 can be replaced by a linear regulator or battery charger, or eliminated altogether. In some embodiments, the wireless power transmitter 1 and/or wireless power test receiver 11 may have communication circuitry (e.g., within or outside controller 5 and 21) for communicating with wireless power receiver 11 either through in-band communication or out of band communication. Similarly, wireless power receiver 11 may have communication circuitry for communicating with a wireless power transmitter 1. The wireless power receiver 11 may send feedback information to the wireless power transmitter 1 indicating the power demanded at the wireless power receiver 11, or a change in the power level to be provided. In response, the wireless power transmitter 1 may increase or decrease its power output accordingly. The wireless power transmitter 1 may control the amount of power transmitted by varying the voltage drive level, the frequency of the signal transmitted or both. Any suitable power control techniques may be used.

As shown in FIG. 6, if a conductive foreign object 20 enters the field produced by the transmit coil 10 of the wireless power transmitter 1, the wireless power transmission efficiency may be degraded and/or the conductive foreign object 20 may undergo significant heating. Examples of conductive foreign objects 20 include coins, paperclips, and keys, by way of illustration.

In some embodiments, foreign object detection may be performed by energizing and controlling the drive circuit of a wireless power transmitter, and measuring a characteristic of a transient in the wireless power transmitter to measure Q-factor and resonant frequency. Based on the transient characteristic the wireless power transmitter can determine whether a foreign object is present in the field produced by the wireless power transmitter. However, Q-factor and resonant frequency can be measured in any suitable way, and is not limited to measuring a characteristic of a transient. In some embodiments, the Q-factor and/or frequency may be detected by frequency-domain measurements, or a combination of time-domain and frequency-domain measurements.

Additional Aspects

As discussed above, a wireless power transmitter and receiver may be controlled using a controller (e.g., controller 5, processor 24), which may be implemented by any suitable type of circuitry. For example, the controllers may be implemented using hardware or a combination of hardware and software. When implemented using software, suitable software code can be executed on any suitable processor (e.g., a microprocessor) or collection of processors. The one or more controllers can be implemented in numerous ways, such as with dedicated hardware, or with general purpose hardware (e.g., one or more processors) that is programmed using microcode or software to perform the functions recited above.

In this respect, it should be appreciated that one implementation of the embodiments described herein comprises at least one computer-readable storage medium (e.g., RAM, ROM, EEPROM, flash memory or other memory technology, or other tangible, non-transitory computer-readable storage medium) encoded with a computer program (i.e., a plurality of executable instructions) that, when executed on one or more processors, performs the above-discussed functions of one or more embodiments. In addition, it should be appreciated that the reference to a computer program which, when executed, performs any of the above-discussed functions, is not limited to an application program running on a host computer. Rather, the terms computer program and software are used herein in a generic sense to reference any type of computer code (e.g., application software, firmware, microcode, or any other form of computer instruction) that can be employed to program one or more processors to implement aspects of the techniques discussed herein.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A test apparatus for testing a foreign object detection (FOD) capability of a wireless power transmitter, the test apparatus comprising:
   a wireless power test receiver;
   at least one temperature sensor configured to sense a temperature of a foreign object between the wireless power test receiver and the wireless power transmitter during wireless power transfer between the wireless power transmitter and the wireless power test receiver;
   a memory configured to store temperatures sensed by the at least one temperature sensor over a test period in which the wireless power transfer occurs, and temporal information regarding times the temperatures are sensed; and
   a processor configured to calculate, based on the temperatures and the temporal information, a predicted temperature of the foreign object at a future point in time after the test period, and to determine a test result based on the predicted temperature,
   wherein the processor is configured to control the wireless power transmitter to perform the FOD during the test period, and the test result indicates an effectiveness of the FOD to detect the foreign object.

2. The test apparatus of claim 1, wherein the processor is configured to run a test program stored in a memory of the test apparatus.

3. The test apparatus of claim 2, wherein the processor is configured to control the wireless power test receiver according to the test program by communicating with the wireless power test receiver through an interface.

4. The test apparatus of claim 3, wherein the processor is configured to control a loading of the wireless power test receiver to obtain a level of power transfer from the wireless power transmitter.

5. The test apparatus of claim 1, wherein the test apparatus is configured to perform the testing when the foreign object is at a first position and configured to perform additional testing when the foreign object is at a second position different from the first position.

6. The test apparatus of claim 1, wherein the processor is configured to perform linear prediction from the temperatures and the times to obtain the predicted temperature.

7. The test apparatus of claim 1, wherein the processor is configured to perform logarithmic prediction from the temperatures and the times to obtain the predicted temperature.

8. The test apparatus of claim 1, wherein the processor is configured to perform the calculation using a plurality of temperatures sensed after a delay after a start of the test period.

9. The test apparatus of claim 8, wherein the delay is determined based upon a rate of change of the sensed temperature.

10. The test apparatus of claim 8, wherein the delay is at least 30 seconds and less than half of the test period.

11. The test apparatus of claim 1, wherein the at least one temperature sensor comprises a plurality of temperature sensors.

12. The test apparatus of claim 11, wherein the plurality of temperature sensors are configured to make a differential temperature measurement at a plurality of locations within or outside of the foreign object.

13. The test apparatus of claim 1, further comprising a thermally conductive material between the foreign object and the wireless power transmitter, between the foreign object and the wireless power test receiver, or both.

14. A method of testing a foreign object detection (FOD) capability of a wireless power transmitter, the method comprising:
   sensing, by at least one temperature sensor, a temperature of a foreign object between a wireless power test receiver and the wireless power transmitter during wireless power transfer between the wireless power transmitter and the wireless power test receiver;
   storing, by a memory, temperatures sensed by the at least one temperature sensor over a test period in which the wireless power transfer occurs, and temporal information regarding times the temperatures are sensed; and
   calculating, by a processor, based on the temperatures and temporal information, a predicted temperature of the foreign object at a future point in time after the test period, such that a test result is determined based on the predicted temperature, wherein the processor controls the wireless power transmitter to perform the FOD during the test period, and the test result indicates an effectiveness of the FOD to detect the foreign object.

15. The method of claim 14, wherein the sensing and storing are performed in part by a test program executed by the processor.

16. The method of claim 15, further comprising controlling the wireless power test receiver according to the test program by communicating with the wireless power test receiver through an interface.

17. The method of claim 16, further comprising controlling a loading of the wireless power test receiver to obtain a level of power transfer from the wireless power transmitter.

18. The method of claim 14, wherein the testing is performed when the foreign object is at a first position and additional testing is performed when the foreign object is at a second position different from the first position.

19. The method of claim 14, wherein linear prediction is performed from the temperatures and the times to obtain the predicted temperature.

20. The method of claim 14, wherein logarithmic prediction is performed from the temperatures and the times to obtain the predicted temperature.

21. The method of claim 14, wherein the calculating is performed using a plurality of temperatures sensed after a delay after a start of the test period.

22. The method of claim 21, wherein the delay is at least 30 seconds and less than half of the test period.

23. A non-transitory computer readable storage medium having stored thereon instructions, which, when executed by a processor, perform a method of testing a foreign object detection (FOD) capability of a wireless power transmitter, the method comprising:
 obtaining, from a memory, temperatures of a foreign object sensed by at least one temperature sensor over a test period during which the foreign object is between a wireless power test receiver and the wireless power transmitter, and temporal information regarding times the temperatures are sensed; and
 obtaining, by a processor, from the temperatures and temporal information, a predicted temperature of the foreign object at a future point in time after the test period;
 determining a test result based on the predicted temperature,
 wherein the processor controls the wireless power transmitter to perform the FOD during the test period, and the test result indicates an effectiveness of the FOD to detect the foreign object.

24. The non-transitory computer readable storage medium of claim 23, wherein the processor is configured to perform prediction to obtain the predicted temperature.

* * * * *